United States Patent
Iggulden et al.

(12) 
(10) Patent No.: US 6,734,097 B2
(45) Date of Patent: May 11, 2004

(54) LINER WITH POOR STEP COVERAGE TO IMPROVE CONTACT RESISTANCE IN W CONTACTS

(75) Inventors: Roy C. Iggulden, Newburgh, NY (US); Padraic Shafer, Beacon, NY (US); Werner Robl, Poughkeepsie, NY (US); Kwong Hon Wong, Wappingers Falls, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 18 days.

(21) Appl. No.: 09/965,094

(22) Filed: Sep. 28, 2001

(65) Prior Publication Data
US 2003/0068894 A1 Apr. 10, 2003

(51) Int. Cl.⁷ .......................................... H01L 21/4763
(52) U.S. Cl. .................. 438/626; 438/633; 438/634; 438/692; 438/717; 438/723; 438/724
(58) Field of Search ............... 438/626, 633, 438/634, 636, 692, 693, 694, 703, 706, 717, 723, 724

(56) References Cited

U.S. PATENT DOCUMENTS

| | | | | |
|---|---|---|---|---|
| 4,898,841 A | * | 2/1990 | Ho | 437/200 |
| 5,486,492 A | * | 1/1996 | Yamamoto et al. | 437/192 |
| 5,625,231 A | | 4/1997 | Huang et al. | |
| 5,654,233 A | | 8/1997 | Yu | |
| 5,654,589 A | | 8/1997 | Huang et al. | |
| 5,741,626 A | * | 4/1998 | Jain et al. | 430/314 |
| 5,904,565 A | * | 5/1999 | Nguyen et al. | 438/687 |
| 5,972,179 A | | 10/1999 | Chittipeddi et al. | |
| 6,001,415 A | * | 12/1999 | Nogami et al. | 427/97 |
| 6,010,940 A | | 1/2000 | Lee et al. | |
| 6,040,243 A | * | 3/2000 | Li et al. | 438/687 |
| 6,093,645 A | | 7/2000 | Ameen et al. | |
| 6,110,826 A | * | 8/2000 | Lou et al. | 438/674 |

* cited by examiner

Primary Examiner—Nadine G. Norton
Assistant Examiner—Duy-Vu Deo
(74) Attorney, Agent, or Firm—Slater & Matsil, L.L.P.

(57) ABSTRACT

A method of filling a damascene structure with liner and W characterized by improved resistance and resistance spread and adequate adhesion comprising: a given damascene structure coated by a liner which purposely provides poor step coverage into the afore mentioned structure, followed by a CVD W deposition, and followed by a metal isolation technique.

14 Claims, 1 Drawing Sheet

LINER WITH POOR STEP COVERAGE TO IMPROVE CONTACT RESISTANCE IN W CONTACTS

BACKGROUND OF THE INVENTION

1. Field of the Invention

The present invention relates to the use of a liner purposely having poor step coverage to improve the properties in W vias. The liner is characterized by appropriate adhesion for the W layer without increasing or widening the resistance values and spread respectively.

2. Description of The Prior Art

In general, semiconductors and integrated circuit devices will comprise a silicon substrate and a doped region(s) disposed in the semiconductor in which there are source or drain connections, separated by a gate or gate control region. Metal connections are made to the source, gate, and drain electrodes by interconnects that are supported over the substrate by an interlayer dielectric material.

Electrical connections are made between different layers by patterning and etching the dielectric to form contact and via openings. The openings are generally filled with electrically conductive materials of plugs made of W (tungsten) that contact previously doped regions, poly silicon or other metal layers. For example, a layer of physical vapor deposited (PVD) metal such as TiN is deposited in the sidewall of the contact/via openings to support adhesion of the electrically conductive material or plug of tungsten.

Since the ground rules or device geometry is getting increasingly smaller and the contact/via aspect ratios are becoming higher, step coverage of the TiN is becoming of increased concern because decreased step coverage requires the TiN layer to be thick enough to ensure sufficient deposition within a contact.

Further, in both single and dual damascene tungsten (W) interconnects contacting unlying metal layers, the contact resistance poses a problem because the W does not stick to oxide, thereby requiring the use of a liner to provide appropriate adhesion on the surface of the wafer; however, the problem is that the liner, which is generally made of TiN or a nitrogen treated Ti increases the contact resistance and also widens the resistance spread.

U.S. Pat. No. 5,625,231 discloses a process for improving the structural and electrical integrity of contacts and interconnects comprising metals deposited by physical vapor deposition (PVD) or chemical vapor deposition (CVD) during processing of small ground rule semiconductor devices. The process entails: applying a TiN contact/via adhesion layer to a high aspect ratio contact/via opening etched in the dielectric by providing a first layer of TiN on the bottom of the contact/via opening and then depositing the second layer of TiN on the first layer of TiN and on the sidewalls of the contact/via opening. The second layer of TiN serves as the contact/via adhesion or glue layer.

A step coverage enhancement process for sub half micron contact/via is disclosed in U.S. Pat. No. 5,654,233. The improved step coverage method for the sub-micron or sub-half-micron contact/via is obtained by using the conventional PVD TiN deposition process coupled with a selective reactive etching process which etches off only the overhang.

U.S. Pat. No. 5,972,179 discloses a composite TiN barrier layer structure formed by depositing a first Ti layer by CVD to obtain good step coverage, followed by a second TiN layer formed by PVD to obtain uniform surface morphology for subsequent deposition of an aluminum alloy contact layer. By using a combination of these deposition techniques, with the last deposit made by PVD, the attributes of both deposition techniques are obtained, i.e. excellent step and bottom coverage characteristics of the CVD technique, and uniform morphology characteristics of the PVD deposition technique.

U.S. Pat. No. 5,654,589 discloses a process for forming multi layer interconnects that entails formation of Ti/TiN stack interconnect structures which may be used as local interconnects and contact landing pads on the same level. The local interconnects and contact landing pads directly contact conductive regions of a semiconductor IC. The contact may be formed with previously doped regions in the semiconductor substrate, polysilicon, or other metal layers.

U.S. Pat. No. 6,093,645 discloses a process for elimination of TiN film deposition in tungsten (W) plug technology using PECVD-Ti and in-situ plasma nitridation.

These patents improve the liner coverage to make sure the liner is covering all portions of the via. By doing this they fix the adhesion that is brought about by the W/oxide interfaces.

In the art of semiconductors where single and dual damascene W interconnects contacting underlying metal layers, where contact resistance is a problem, because the W does not stick to oxide, and wherein a liner is utilized to provide appropriate adhesion on the surface sidewall of the wafer, and wherein the liner (generally made of TiN or a nitrogen treated Ti) increases the contact resistance and also widens the resistance spread, there is a need for a liner that has very poor step coverage, that will coat the surface (to provide the necessary bulk adhesion for W) but have little or no coverage at the via bottom and via sidewalls so that there is improvements in via resistance and its spread.

The invention findings indicate that the vias themselves do not need to be coated with liner to achieve bulk adhesion.

SUMMARY OF THE INVENTION

One object of the present invention is to provide, in the case of a single damascene, where W interconnects contacting underlying metal layers and where the contact resistance is a problem, a liner with poor step coverage to improve the contact resistance in the W contacts.

Another object of the present invention is to provide, in the case of a dual damascene, where W interconnects contacting underlying metal layers and wherein the contact resistance is a problem, a liner with poor step coverage to improve the contact resistance in the W contacts.

A further object of the present invention is to provide, in the case of both single and dual damascene W interconnects contacting underlying metal layers and where the contact resistance is a problem because W does not stick to oxide and thereby requires a liner to secure adequate adhesion on the surface and sidewall of the wafer, a replacement of the traditional liner with a liner of poor step coverage which will coat the surface but have no coverage at the via bottom.

A further object yet still of the present invention is to provide, in the case of both single and dual damascene W interconnects contacting underlying metal layers and where the contact resistance is a problem because W does not stick to oxide and thereby requires a liner to secure adhesion to the surface and sidewall of the wafer, a replacement of the traditional liner with a liner that decreases the contact resistance and lessens the resistance spread, through the use of a very poor step coverage PVD TiN coating, so that coating of the surface is provided without coverage at the via bottom.

These and other objects of the present invention will be more particularly described in the brief description of the drawings and detailed description of the preferred embodiments of the invention.

BRIEF DESCRIPTION OF THE DRAWINGS

FIG. 1b shows forming a line trench in the ILD layer of FIG. 1a.

DETAILED DESCRIPTION OF PREFERRED EMBODIMENT OF THE INVENTION

Figure 1A:
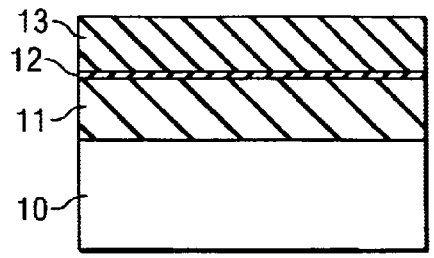
FIG. 1a shows forming an interlevel dielectric layer and intermetal dielectric layer that is separated by an etch-stop layer on a semiconductor substrate in accordance with the invention.

The present invention is directed to fabricating and manufacturing a current carrying metal filled contact/vias of sub-micron diameter using a liner with poor step coverage to improve the contact resistance in W contacts. The process can be used in MOSFET or CMOS or any high density semiconductor device presently being manufactured in the semiconductor industry; however, only those specific areas unique to comprehension of this invention will be described.

In general, a conductive plug filling a via hole is formed by depositing an interlayer dielectric (ILD) on a conductive layer comprising at least one conductive layer comprising at least one conductive pattern, forming an opening through the ILD by photolithographic and etching techniques, and filling the opening with a conductive material. Excess conductive material on the surface of the ILD is generally removed by chemical mechanical polishing (CMP). One such method is known as the single damascene technique and entails the formation of an opening which is filled in with a metal.

Another such method is the dual damascene technique, which involves the formation of an opening comprising a lower contact or via hole section in communication with an upper trench section, which opening is filled with a conductive material, such as a tungsten, to simultaneously form a conductive plug in electrical contact with a conductive line.

The invention process is accomplished by providing a semiconductor substrate having active and passive regions; forming an interlevel dielectric (ILD) layer over the substrate having active and passive regions; forming an etch-stop layer over the ILD layer; forming an intermetal dielectric (IMD) layer over the etch-stop layer; forming a first photoresist layer over the IMD layer and patterning the photoresist layer with a mask comprising a line trench pattern; etching through the line trench pattern in the first photoresist layer to form the line trench pattern into the IMD layer, wherein the line trench has a sidewall and a flat bottom; removing the first photoresist layer; forming a second photoresist layer over the IMD layer and and line trench having sidewalls; patterning the second photoresist layer with a mask comprising a contact hole pattern; etching through the contact hole pattern in the second photoresist layer to form a contact hole pattern into the interlevel dielectric (ILD) layer; removing the second photoresist layer; cleaning the contact hole; depositing a liner of very poor step coverage TiN by PVD in the line trench and the contact hole composite structure; and performing chemical mechanical polish to planarize the substrate for later process steps to finish fabrication of the semiconductor substrate.

Reference is now made to FIGS. 1a–f, where there is shown a dual damascene process using very poor step coverage PVD TiN to coat the surface but to basically provide no coverage of the via bottom. The process employs tungsten chemical vapor deposition for forming composite structures with local interconnects comprising line trenches with contact holes, and composite structures for intermetal interconnects with line trenches with via holes.

FIG. 1a shows a semiconductor substrate 10, with a substructure of devices formed therein; however, where they are not necessary to the invention, they will not be described in detail. The dual damascene process is applied in forming interconnects through via holes between metal layers. The method is applicable to both local interconnects with contact holes and to intermetal interconnects comprising via holes.

An interlevel dielectric (ILD) layer 11, is formed on substrate 10 of FIG. 1a. As is known, blanket dielectric layers may be formed from materials including silicon oxide materials, silicon nitride materials, and silicon oxynitrides materials formed within integrated circuits through methods of CVD, PECVD, PVD sputtering. In the invention, the blanket ILD layer is preferably formed of silicon oxide. An etch-stop layer 12, preferably of silicon nitride, is then formed over ILD layer 11. The etch-stop layer serves to stop etching when the next layer is etched to form line trenches.

The next layer of dielectric 13 in FIG. 1a is the intermetal dielectric (IMD) layer formed above the ILD layer and below the first metal layer that will be formed later. A phosphosilicate glass (PSG), or, an oxide formed by the decomposition of tetraethyl orthosilicate (TEOS) may be the IMD and is formed using a plasma enhanced chemical vapor deposition (PECVD).

A first layer of photoresist (not shown) is formed over IMD layer 13 and patterned with a mask having images of a line trench.

Figure 1D:
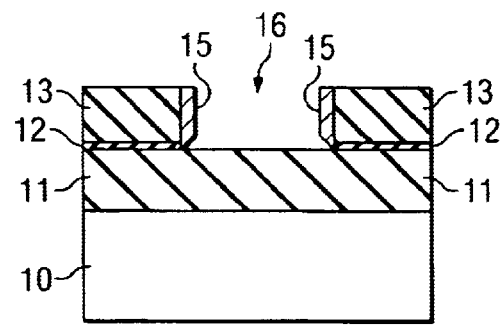
FIG. 1d shows removal of the very poor step coverage PVD TiN layer, except from sidewalls of the line trench.
Figure 1B:
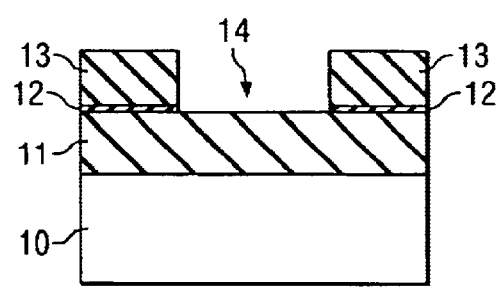

Line trench 14 in FIG. 1b is formed by etching the line trench pattern in the first photoresist layer into IMD layer 13 until etch-stop layer 12 is reached. Etching is accomplished with a mixture comprising gases of $O_2$, $SO_2$ and $CF_4$. The etchant is then modified to a mixture of gases $O_2$, $SO_2$, $CF_4$ and He so that the etch-stop, silicon nitride layer 12, can be removed from the bottom of trench 14 as shown in FIG. 1b. After removal of the portion of etch-stop layer at the bottom of trench 14, the first photoresist layer is removed.

Figure 1E:
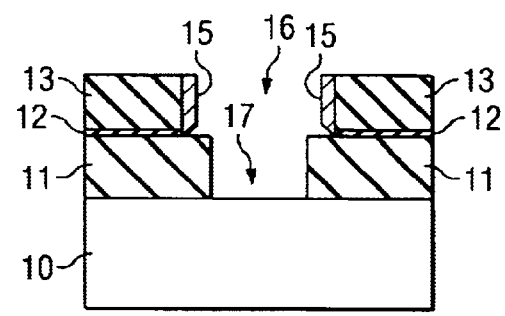
FIG. 1e shows forming a contact hole in the substrate of FIG. 1d.
Figure 1C:
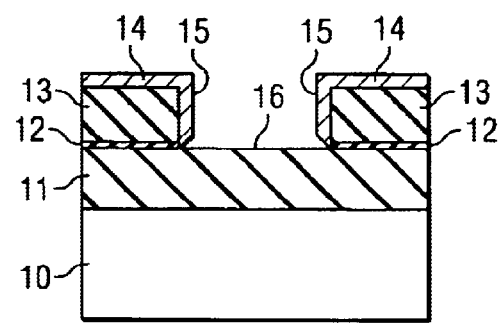
FIG. 1c shows forming a very poor step coverage PVD TiN layer according to the invention.

The essential feature of the present invention is to next introduce the step of providing a liner characterized by very poor step coverage, such as PVD TiN to coat the surface but have basically no coverage at the via bottom, as is shown in FIG. 1c. In FIG. 1c TiN is deposited by physical vapor deposition (PVD) and this PVD TiN layer 14 affects coverage of the sidewall 15 of the via 16 and surface coats dielectric layer 13, but basically provides no coverage at the via bottom, as is shown in FIG. 1c.

The PVD TiN very poor step coverage layer 14 is next removed from the surface of the dielectric layer 13 but not the sidewalls 15 as shown in FIG. 1d. The removal is accomplished by using a reactive ion etch which may comprise a mixture of $SF_6$, Hbr, and $CCl_4$. Alternatively, layer 14 may be removed using a CMP.

With layer 15 in place on the sidewalls of trench 16 a second layer of photoresist is formed over layer 11 and then patterned using a mask having images of a contact hole. As may be seen from FIG. 1e, contact hole 17 is formed by etching the contact hole pattern in the second photoresist layer 13 until the surface of the substrate 10 is reached. The etching through the contact hole pattern in the second photoresist layer into the ILD layer may be accomplished using a gaseous mixture comprising Ar, $CHF_3$ and $C_4F_8$. Following etching of the contact hole 17, the hole may optionally be cleaned by a well known technique such as sputtering.

As may be seen from FIG. 1e, the structure comprising line trench 15 and contact hole 17 collectively form the damascene structure where the side-walls of the trench are covered with the very poor step coverage layer of PVD TiN, that basically provide no coverage at the via bottom.

Figure 1F:
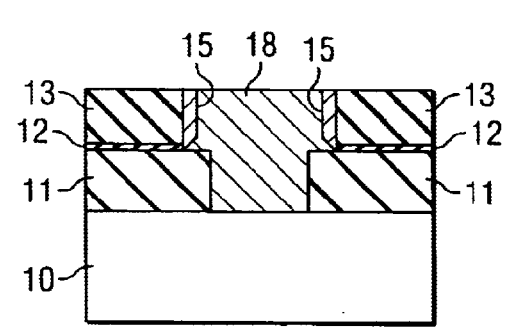
FIG. 1f shows forming the dual damascene structure by tungsten (W) CVD deposition into the line trench and contact hole structure.

The tungsten (W) interconnects contacting the underlying middle layers is next deposited into this damascene structure, as shown in FIG. 1f. The tungsten interconnect 18 may be deposited using CVD by utilizing any well known process; however, exemplary of the process utilized to deposit the tungsten interconnect is that of silane reduction, as shown by the reaction in the following formula:

$$WF_6 + 3SiH_4 \rightarrow 2W + 3SiF_4 + 6H_2$$

TABLE 1

| Liner | Contact Resistance Range |
|---|---|
| IMP TI | 4.5–7 |
| CVD TiN | 4.2–4.7 |
| PVD TiN | 3.0–3.2 |

As may be seen from Table 1, when a very poor step coverage liner, such as PVD TiN is utilized, adequate adhesion of the W interconnects is provided without harming the contact resistance.

While the invention has been described with reference to preferred embodiment, it is to be understood by those skilled in the art that various modifications may be made thereto without departing from the spirit and scope of the invention, which is defined by the attended claims.

What is claimed is:

1. A method for fabricating a damascene structure comprising at least one conductive metal line formed in a top dielectric layer over a substrate, said damascene structure characterized by improved resistance and acceptable adhesion, said method comprising the steps of:

providing a structure comprising a substrate and a top dielectric layer forming a trench having sidewalls and a bottom for at least one conductive line in said top dielectric layer;

physical vapor depositing (PVD) a titanium nitride layer to obtain a liner having very poor step coverage such that the top surface of said top dielectric layer is covered with a layer of titanium nitride and the sidewalls of said at least one trench are substantially covered with a layer of titanium nitride while the bottom of said at least one trench is left substantially free of titanium nitride during said PVD deposition;

removing the titanium nitride from the surface of the top dielectric layer and leaving the titanium nitride on the sidewalls intact; and depositing tungsten into said damascene structure so as to fill said contact hole/via and said at least one trench.

2. The method of claim 1, wherein said step of providing a structure further comprises a bottom dielectric layer between the substrate and the top dielectric layer, said method further comprising the step of forming at least one contact hole/via extending from the bottom of said trench formed in the top dielectric layer and through said bottom dielectric layer to said substrate and filling said contact hole/via together with said at least one trench with tungsten.

3. The method of claim 2 wherein said damascene structure is a dual damascene structure.

4. The method of claim 2, further comprising the step of cleaning said contact hole/via prior to depositing tungsten.

5. The method of claim 4 wherein said cleaning is performed by RIE.

6. The method of claim 2, wherein said step of providing a structure further comprises an etch stop layer between said top dielectric layer and said bottom dielectric layer.

7. The method of claim 6 wherein said etch-stop layer is silicon nitride.

8. The method of claim 6, wherein said bottom dielectric layer is an RD (inter level dielectric) layer formed of silicon oxide and said top dielectric layer is an IMD (inter metal dielectric) layer formed of a material selected from the group consisting of phosphosilicate glass (PSG) and an oxide formed by the decomposition of tetraethyl orthosilicate (TEOS).

9. The method of claim 8, further comprising the steps of forming and patterning a first layer of photoresist having an image of said trench prior to said step of forming a trench and forming and patterning a second layer of photoresist having an image of said contact hole/via prior to said step of forming at least one contact hole.

10. The method of claim 9 wherein said etching through said contact hole pattern in said second photoresist layer into said ILd layer is performed with a mixture comprising gases of Ar, $CHF_3$ and $C_4F_8$.

11. The method of claim 10 wherein said etching through said line trench pattern in said first phototresist layer into said IMD layer is performed until said etch-stop layer is reached.

12. The method of claim 8 wherein said etching through said line trench pattern of said first photoresist layer into said IMD layer is performed with a mixture comprising gases of $O_2$, He and $CF_4$.

13. The method of claim 1 wherein said step of removing titanium nitride is by CM.

14. The method of claim 1, wherein said step of removing titanium nitride comprises removing with a reactive ion etch (RIE) using a mixture of $SF_6$, HBr and $CCL_4$.

* * * * *

UNITED STATES PATENT AND TRADEMARK OFFICE
CERTIFICATE OF CORRECTION

PATENT NO. : 6,734,097 B2
DATED : May 11, 2004
INVENTOR(S) : Iggulden et al.

It is certified that error appears in the above-identified patent and that said Letters Patent is hereby corrected as shown below:

<u>Column 6,</u>
Line 30, delete "RD" and insert -- ILD --.
Line 44, delete "ILd" and insert -- ILD --.
Line 55, delete "CM" and insert -- CMP --.

Signed and Sealed this

Seventh Day of December, 2004

JON W. DUDAS
*Director of the United States Patent and Trademark Office*